United States Patent [19]
Duby et al.

[11] Patent Number: 4,749,948
[45] Date of Patent: Jun. 7, 1988

[54] NMR IMAGING SYSTEMS

[75] Inventors: Tomas Duby, Raanana; Noam Kaplan, Mobile Post Harey Yerushalim; Yuval Zur, Netanya, all of Israel

[73] Assignee: Elscint Ltd., Haifa, Israel

[21] Appl. No.: 749,264

[22] Filed: Jun. 27, 1985

[30] Foreign Application Priority Data

Jul. 12, 1984 [IL] Israel .......................................... 72388

[51] Int. Cl.[4] ............................................. G01R 33/22
[52] U.S. Cl. ...................................... 324/320; 324/308
[58] Field of Search ............... 324/308, 300, 320, 318, 324/309, 307

[56]  References Cited

U.S. PATENT DOCUMENTS

| 4,528,510 | 7/1985 | Loeffler et al. ................. 324/309 |
| 4,551,678 | 11/1985 | Morgan et al. ................. 324/300 |
| 4,623,844 | 11/1986 | Macovski ................. 324/313 X |
| 4,625,168 | 11/1986 | Meyer et al. ................. 324/318 X |

FOREIGN PATENT DOCUMENTS 2043914 10/1980 United Kingdom ................ 324/307

OTHER PUBLICATIONS

2nd Annual Meeting of Society of Magnetic Resonance Imaging in Medicine—San Francisco, Aug. 19, 1983; paper entitled "Field Measurement by Fourier Imaging"; an unnumbered page and page 337; H. E. Simon et al.

*Primary Examiner*—Tom Noland
*Attorney, Agent, or Firm*—Sandler & Greenblum

[57]  ABSTRACT

An automatic shimming system for correcting inhomogeneities in magnetic resonance magnetic fields. The static magnetic field is mapped using three dimensional phantoms that comprise a plurality of samples including at least an element having non-zero nuclear magnetic moments spatially distributed to enable uniquely locating each sample with only two locating gradients.

14 Claims, 4 Drawing Sheets

NMR IMAGING SYSTEMS

FIELD OF THE INVENTION

This invention is concerned with NMR imaging systems and more particularly with apparatus and methods for shimming magnets of NMR imaging systems and correcting for the inherent magnetic field inhomogeneity of the NMR imaging system.

BACKGROUND OF THE INVENTION

The procedure for correcting the lack of homogeneity is called shimming. It consists of two steps:

(i) mapping the magnetic field at certain points lying on the surface of a sphere centered at the magnet center, and (ii) correcting field inhomogeneities by driving certain currents through individual shimming coils to generate new magnetic fields that correct for the lack of homogeneity.

Shimming the NMR magnets to improve the magnetic homogeneity presently is accomplished semimanually. More particularly, the magnetic field of the NMR imaging systems is measured for homogeneity using probes in particular regions of the static magnetic field or by imaging phantoms in particular regions. Ideally of course, the static magnetic field should be universally homogeneous within the bore of th magnet. In practice there is a small but not neglectabe lack of homogeneity in all NMR magnets. Shim coils are used to correct for this lack of homogeneity. When the shimming coil currents are applied, new mapping is done and compared. Finally the current intensities are adjusted. The measuring and shimming steps are repeated until sufficient homogeneity is obtained.

This is understandably a very time consuming process. NMR systems are costly, therefore, in order to be cost effective for hospitals and clinics, the systems require minimum down time and maximum operating time. Accordingly, it is in the interest of manufacturers of the NMR systems to provide for shimming the magnetic field automatically to correct inhomogeneities in as short a time as possible and with the use of the least amount of manpower as possible.

In the prior art, attempts have been made to use phantoms within the central region of the magnet to map the magnetic field there. Such field mapping by imaging is, for example, disclosed in a publication of the Society of Magnetic Resonance Imaging in Medicine at the second annual meeting of the society in San Francisco on Aug. 19, 1983 in a paper entitled "Field Measurement by Fourier Imaging" authored by A. G. Simon et al of the Columbia University of Physicians and Surgeons. In that article the authors suggest use of phantoms that comprise a single straight tube on an array of tubes in a circular disc. The article describes a phantom that is a thin water filled disc.

The use of the thin water filled disc measures the field homogeneity in only a single plane. A plurality of such water filled discs would test the homogeneity in a plurality of planes but would require a rather complicated and time consuming three dimensional computation to obtain a map of the magnetic field intensities. Thus the requirement for efficient inhomogeneity corrections persists.

BRIEF DESCRIPTION OF THE INVENTION

Accordingly it is the object of the present invention to provide an automatic shimming system for correcting for the inhomogeneities of NMR magnetic fields, said system comprising:
- means for generating static magnetic fields for an NMR imaging system,
- shim coils to correct inhomogeneities is said static magnetic fields,
- means for mapping the static magnetic field of an NMR imaging system, said mapping means including:
- three-dimensional phantom means for simplifying the field mapping, said phantom comprising:
- a plurality of samples including an element having non-zero nuclear magnetic moments spatially distributed in said three-dimensional phantom, to enable positively uniquely locating each of said samples with only two encoding gradients,
- means for obtaining field mapping data of said three dimensional phantom,
- means for evaluating the field, mapping data to determine field inhomogeneity, and
- means responsive to said evaluated field mapping data for adjusting the currents through the individual shim coils until required field homogeneity is obtained.

A feature of the invention includes a unique phantom for mapping the magnetic field. The phantom comprises a number of water filled vials placed on the surface of a sphere. The water filled vials are arranged so that magnetic field intensity data of each individual vial in the phantom is readily obtained. Alternatively each of the vials could be surrounded by an RF coil and individually sampled to obtain a measurement of magnetic field density at particular locations in the static magnetic field.

Responsive to a comparison of the field homogeneity measurements control circuits adjust currents through individual shim windings to correct for the measured non-homogeneities of the field.

BRIEF DESCRIPTION OF THE DRAWINGS

The above mentioned and other features and objects of the present invention will be better understood when considered in the light of the following description taken in conjunction with the accompanying drawings wherein.

GENERAL DESCRIPTION

Figure 1:
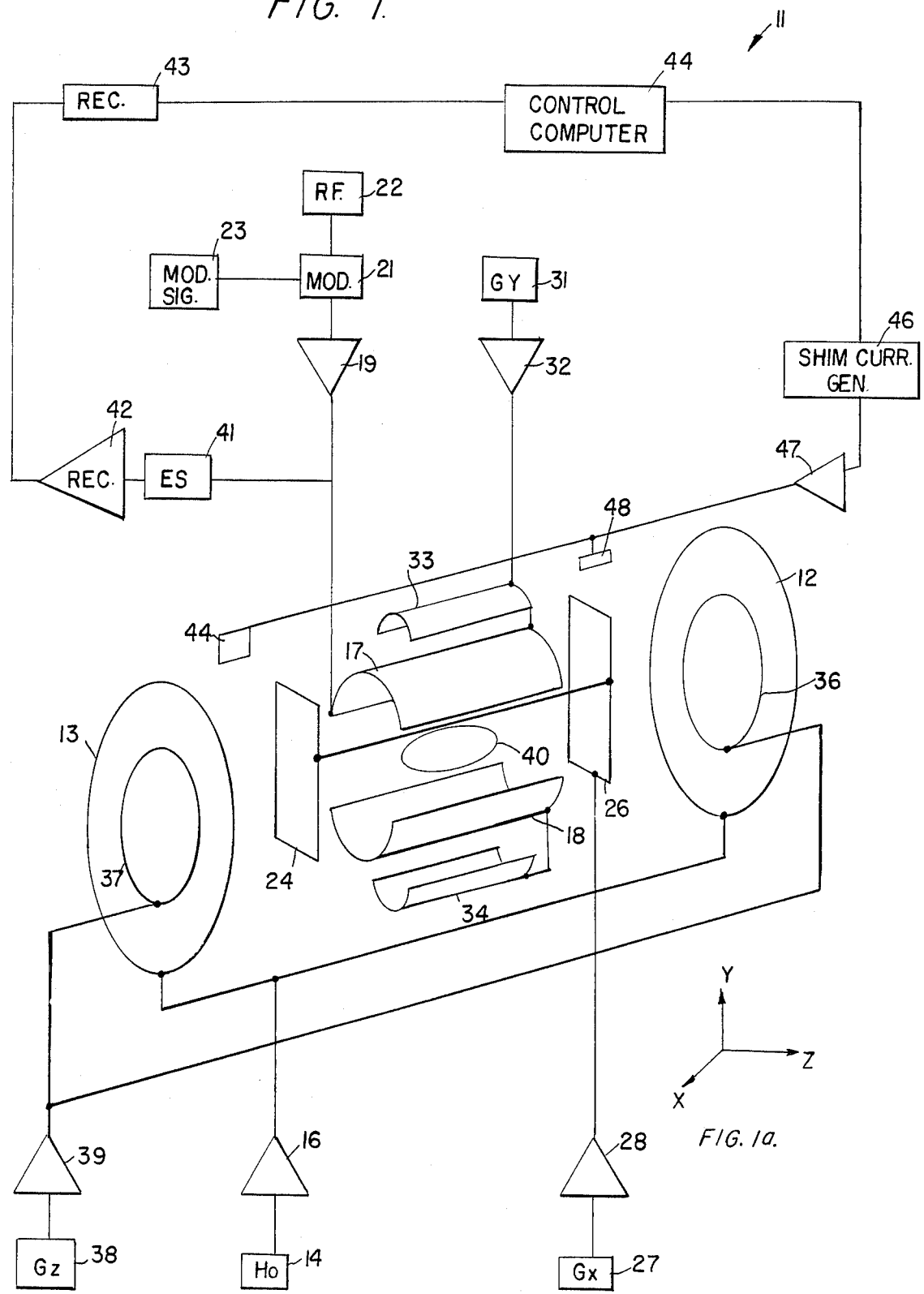
FIG. 1 is a general block diagram of an NMR imaging system utilizing the phantom of this invention.

The block diagram of FIG. 1 shows an NMR imaging system 11. The NMR imaging system comprises magnet coils 12 and 13 used for generating the static magnetic field. The coils 12, 13 are supplied current by a generator 14 shown in the block diagram.

The system also includes the RF coils 17 and 18 which are used (1) to excite the nuclear magnetization from its equilibrium instituted by the static magnetic field generated by 12 and 13; and (2) to pick up the Free Induction Decay signal generated by the nuclear magnetic moments being out of equilibrium.

The RF coils 17, 18 obtain current through RF amplifier 19 that receives its signal from a modulator 21. The modulator 21 operates on the radio frequency signal obtained from radio frequency generator 22. The modulating signal is shown as being supplied by modulating signal generator 23.

Means are provided for varying the static magnetic field spatially. These means can include the X gradient coils shown at 24 and 26 which are supplied current from an X gradient generator 27 and X gradient amplifier 28. Similarly the static field is altered by a Y gradient for spatially varying the static magnetic field along the Y axis. The means for accomplishing this variation is shown as Y gradient generator 31 which supplies current through Y gradient amplifier 32 to the Y gradient coils 33 and 34.

The static field is also varied spatially along the Z axis through the use of coils of 36 and 37. The gradient coils receive their current from Z gradient generator 38 through Z gradient amplifier 39. It should be noted that the X, Y and coordinates referred to are shown in FIG. 1A.

Means are provided in a preferred embodiment for testing the homogeneity of the magnetic fields without having to repeatedly move a probe. More particularly, there is shown the unique three-dimensional spherical-like phantom 40. The phantom is comprised of a plurality of samples of a material such as water having elements with non-zero nuclear magnetization. The distribution of the samples in the spherical-like, three-dimensional phantom is such that the number of measurements required to obtain the field homogeneity is minimized while at the same time the measurements of the homogeneity of the static field is sufficient to properly correct for inhomogeneities up to a certain order, of the type normally encountered in NMR systems, i.e. up to 500 ppm.

Means are provided for measuring the response to the nuclear magnetization pulse. This means is shown as including the same radio frequency coils 17 and 18 connected through an electronic switch 41 and a amplifier 42 to a receiver 43.

The output of the receiver is connected to computer 44. The computer 44 includes means for transforming the information obtained by the receiver into magnetic field intensities at each sample of the phantom 39. Furthermore the computer 44 determines the amount to vary individual shim currents to correct the magnetic field inhomogeneity.

The inhomogeneity of the field is corrected with the shim current generator 46 which couples current through an amplifier 47 to shim coils depicted herein, by way example, as shim coils 48 and 49.

Figure 2:
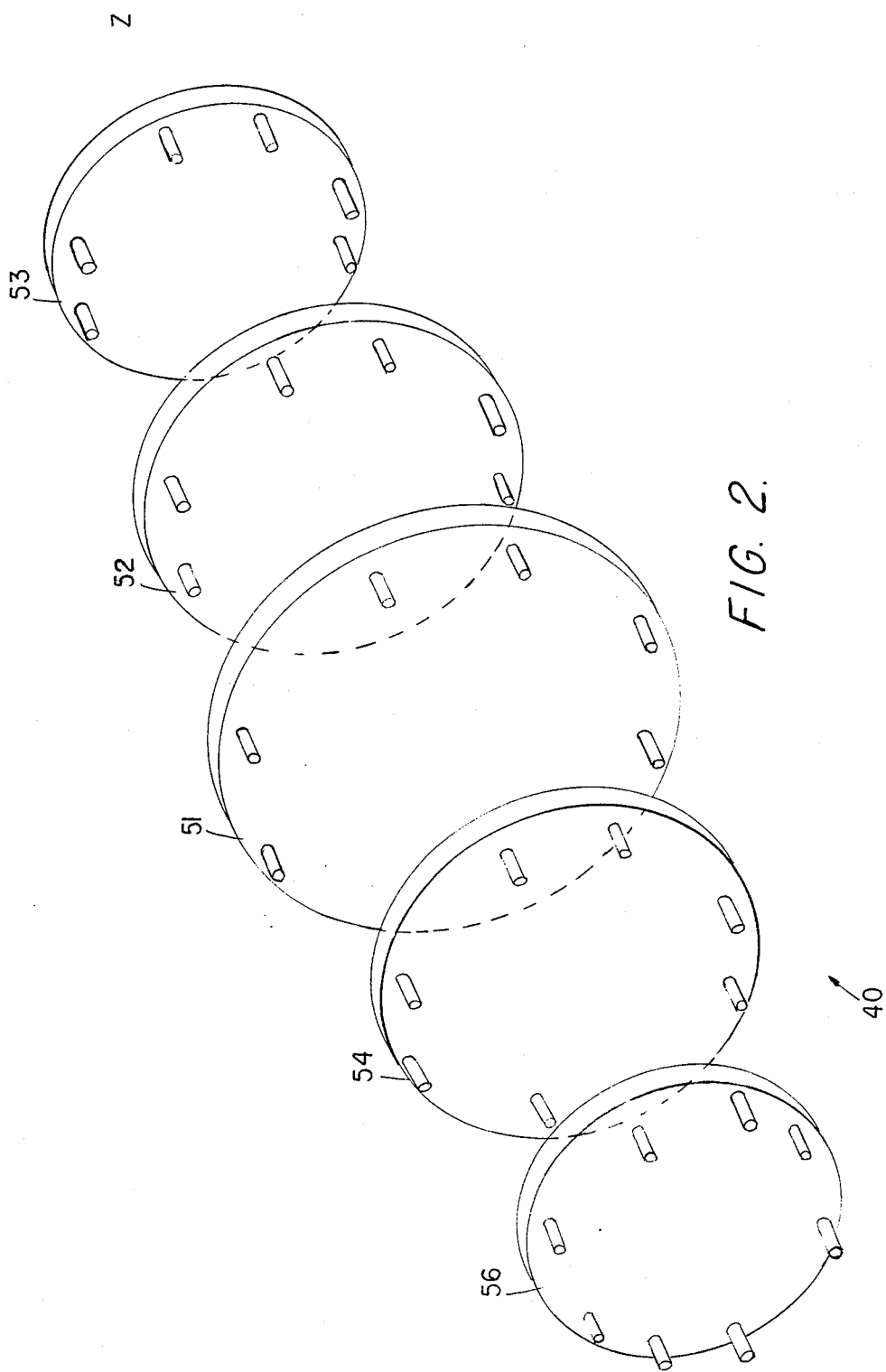
FIG. 2 is an exploded view one embodiment of the phantom.
Figure 3:
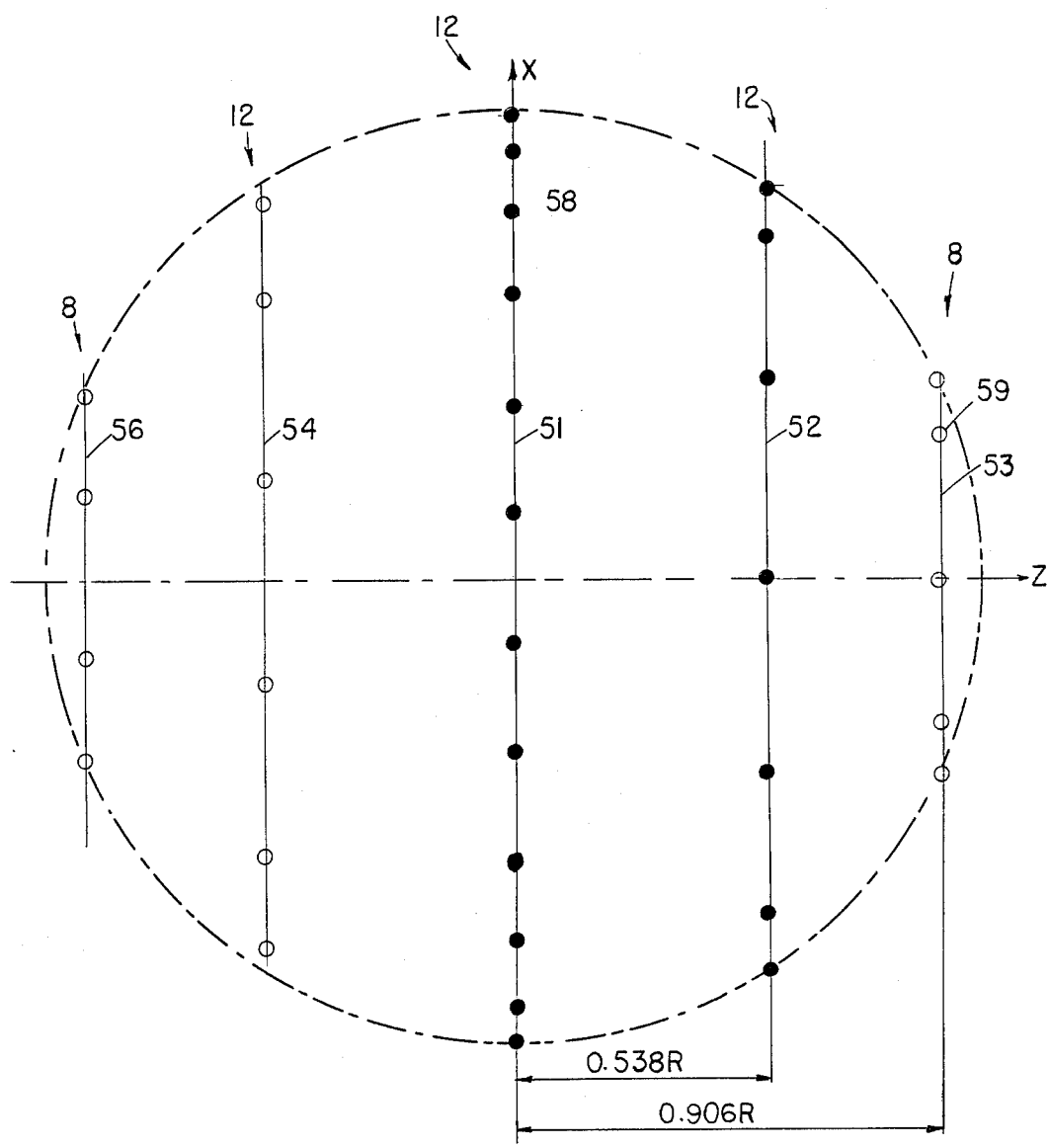
FIG. 3 is a view of the phantom looking along the Y axis in the normal X, Y, Z coordinates used in conjunction with NMR imaging systems.

FIG. 2 is an exploded view of the phantom 40. The three-dimensional spherical-like phantom as shown in FIGS. 2 and 3 comprises five planes. There is a center plane 51 flanked by two planes 52 and 53 on the right side and two plane 54, 56 on the left side. It should be understood that the invention is not limited to the number of planes used (nor to the number of vials used per plane) in this exemplary phantom.

The planes 51, 52, 54 and 56 are shown in FIG. 2 as being planes parallel to the Z=0 plane. Plane 51 contains 12 vials. Planes 52 and 54 also contain 12 vials while plane 53 and 56 each contain 8 vials. It should be noted that in FIGS. 3 and 4 all vials with Z coordinate positive or zero are marked by black circles, while with negative Z coordinate with white circle.

Figure 4:
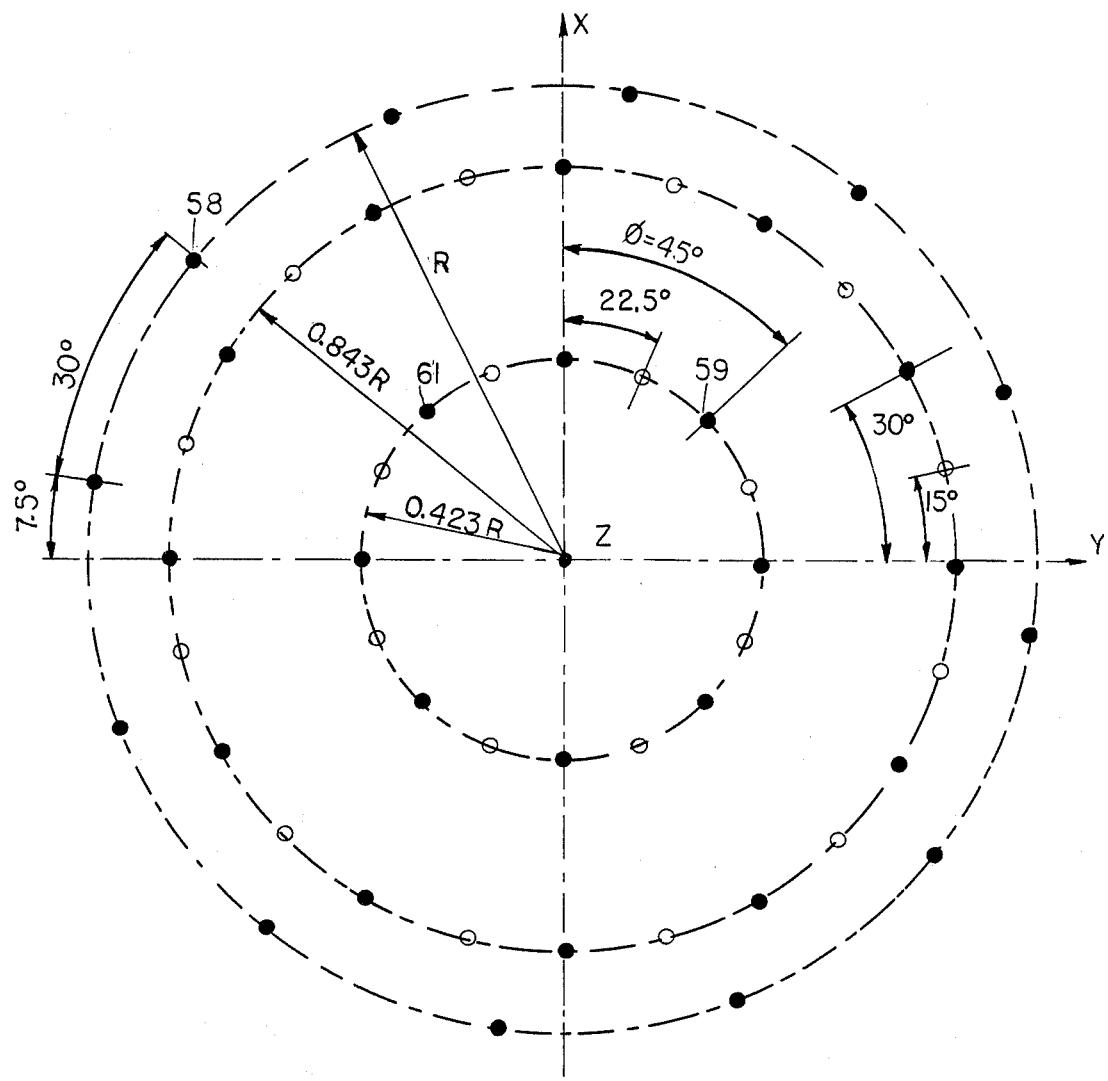
FIG. 4 is a showing of the water samples of FIG. 3 projected onto the XY (or Z=0) plane.

FIG. 4 shows the vials projected onto the Z=0 plane. A unique advantage of this phantom is that from this two dimensional projection the position the position of each vial in space is uniquely determined even when using only two gradient fields. For example, by using X and Y gradients it is readily determined that vial 58 belongs to plane 51. This may be deduced from the radius of the circle on which vial 58 lies. The radius is of course determined from the X and Y coordinates. Vial 59 may belong to planes 53 or 56. Since the angles of all vials in planes 53 and 56 are chosen so that in a projection onto the Z=0 plane no two vials would overlap. Hence the angle $\phi$ shows that vial 59 belongs to plane 53. It should be understood that this invention is not limited to phantoms with vials having a unique two-dimensional projection.

Consequently the procedure for acquiring complete location information on the vials in the phantom, during data data acquisition, is greatly simplified and reduced in time. It is sufficient to obtain a two dimensional projection using gradients X and Y only, both as phase encoding gradients.

In preferred head and body coil phantoms the following dimensions were used for measurements of the sphere, the Z location of the planes and the radius of each of the planes.

| Plane No. | Sphere Rad. = 150 mm | | Sphere Rad. = 250 mm | |
|---|---|---|---|---|
| | Zmm | Plane rmm | Zmm | Plane rmm |
| 56 | −135.9 | 63.5 | −226.5 | 105.8 |
| 54 | −80.7 | 126.5 | −134.5 | 210.8 |
| 51 | 0 | 150 | 0 | 250 |
| 52 | +80.7 | +126.5 | 134.5 | 210.8 |
| 53 | +135.9 | 63.5 | 226.5 | 105.8 |

The location of the samples was determined by using a Gaussian Quadrature for five points as obtained from Table 25.4 on Page 216 of the "Handbook of Mathematical Functions" Published by Dover Publications.

The pertinent portions of Table 25.4 are:

Abscissas = $\pm x_i$ (zeroes of Legendre Polynomials)

n = 5

$\pm x_i$ 0.00000

0.53846

0.90617

In operation, acquisition is made by applying an RF frequency to the RF coils 17 and 18 to excite the samples in the phantom. The X and Y gradients cause particular coordinate dependent phase shifts to the nuclear magnetization of the samples. The FID signal is observed and measured. The reconstructed FID signal data in this case gives an indication of the homogeneity of the field. A matrix of space resolved FID frequencies is obtained. The frequencies provide a measure of the magnetic field homogeneity. The individual shim coil currents are controlled by the computer 44 and adjusted until the desired magnetic field homogeneity is obtained as indicated when the data from each of the samples are substantially equal to each other. The shim coil algorithm is well known to those skilled in the art.

While this invention has been described using particular embodiments, it should be understood that this described is made by way of example only, and not as a limitation on the scope of the invention, which is defined by the accompanying claims.

What is claimed is:

1. An automatic shimming system for improving the homogeneity of NMR magnetic fields, said system comprising:

means for generating magnetic fields for NMR imaging systems, said fields comprising a static magnetic field, gradient magnetic fields, and a radio frequency magnetic field, shim coils to correct inhomogeneities of said static magnetic field, means for mapping said static magnetic field, said mapping means comprising a three dimensional phantom, said phantom comprising:

a plurality of samples of an element having non-zero nuclear magnetic moments distributed at particular locations in selected planes in the three-dimensional phantom, means for obtaining data of individual ones of said samples in said selected planes of said three-dimensional phantom using pick up coils normally used for acquiring NMR data of patients, means for comparing the data obtained for each of the samples, and means for adjusting current through the shim coils until said obtained data from each of said samples indicate desired homogeneity.

2. The automatic shimming system of claim 1 wherein said means for obtaining data of individual ones of said samples in said selected planes of said three dimensional phantom comprises uniquely locating the samples in the phantom to enable determining each of said locations using only two gradients, one gradient determining a plane of each of said samples and the second gradient determining the unique location of each of said samples per plane.

3. The automatic shimming system of claim 1 wherein the phantom is dimensioned to fit within RF body coil means.

4. The automatic shimming system of claim 1 wherein the phantom is dimensioned to fit within RF head coil means.

5. A phantom for use in mapping the static magnetic field of NMR imaging systems, said phantom comprising:

a three-dimensional unit having samples distributed at selected points, said selected points being along the intersection of a plurality of parallel planes and a surface of said three dimensional unit, and said selected points further being distinguished by being placed to that projections of said samples onto a plane parallel to said parallel planes do not overlap.

6. The phantom of claim 5 wherein said three dimensional unit is a sphere and said surface is the outer surface of said sphere.

7. An automatic shimming system for improving the homogeneity of NMR magnetic fields, said system comprising:

(a) means for generating magnetic fields for NMR imaging systems, said fields comprising;
   (b) a static magnetic field, gradient magnetic fields, and a radio frequency magnetic field;
   (c) shim coils to correct inhomogeneities of said static magnetic field;
   (d) means for mapping said static magnetic field;
   (e) said mapping means comprising a three-dimensional phantom, said phantom comprising:
      (1) a plurality of samples of an element having non-zero nuclear magnetic moments distributed at particular locations in selected planes in the three dimensional phantom;
      (2) said three dimentional phantom being spherical, with the samples located at particular locations are the surface of the sphere along a plurality of parallel planes;
      (3) means including the particular locations thereof for obtaining certain data of individual ones of said samples in selected planes of said three dimensional phantom;
      (4) means for comparing the data obtained from each of the samples; and
      (5) means for adjusting current through the shim coils until said obtained certain data from each of said samples are substantially equal.

8. The automatic shimming system of claim 7 wherein certain of said parallel planes have equal radii at their intersection with the surface of said sphere, and wherein the samples on said parallel planes with equal radii are at different angular positions whereby projections of said samples from said parallel planes with the equal radii onto another plane do not overlap.

9. The automatic shimming system of claim 8 wherein said means for generating said static magnetic field comprises a main horizontal cylindrical magnet having a bore therethrough that is coaxial with the longitudinal axis of the main horizontal cylindrical magnet, said parallel planes are separated in the Z axis direction when the longitudinal direction of the bore of the main magnet lies along the Z axis.

10. The automatic shimming system of 7 wherein said locations of said samples are determinable using only X and Y gradients.

11. The automatic shimming system of claim 7 wherein five parallel planes are proved, a first parallel plane having a radius equal to the radius of the sphere, second and third parallel planes having equal radii less than the radius of said first parallel plane, and fourth and fifth parallel planes having equal radii less than the radii of said second and third parallel planes.

12. The automatic shimming system of claim 11 wherein the distances between said parallel planes are set according to the abscissas for Gaussian Quadratures for five points.

13. The automatic shimming system of claim 12 wherein said first, second and third planes have the same number of samples and wherein said fourth and fifth planes have the same number of samples.

14. The automatic shimming system of claim 13 wherein said first, second and third planes contain twelve equally spaced samples each and said fourth and fifth planes contain eight equally spaced samples each.

* * * * *